（12） United States Patent
Chen et al.

(10) Patent No.: US 6,489,684 B1
(45) Date of Patent: Dec. 3, 2002

(54) REDUCTION OF ELECTROMIGRATION IN DUAL DAMASCENE CONNECTOR

(75) Inventors: Sheng Hsiung Chen, Taichung Connty (TW); Tsu Shi, Hsin-Chu (TW); Ming Tsai, Taipei (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/854,992

(22) Filed: May 14, 2001

(51) Int. Cl.[7] ............................................. H01L 29/40
(52) U.S. Cl. ...................... 257/774; 257/773; 257/775
(58) Field of Search ................................ 257/744, 773, 257/775, 774; 438/602, 629, 618, 666, 637

(56) References Cited

U.S. PATENT DOCUMENTS 5,696,030 A    12/1997  Cronin ..................... 437/208
5,770,519 A    6/1998   Klein et al. ................. 438/639
5,963,831 A    10/1999  Fu .............................. 438/666
6,072,945 A    6/2000   Aji et al. ............... 395/500.06
6,091,080 A    7/2000   Usui ........................... 257/48
6,333,558 B1 * 12/2001  Hasegawa ................... 257/759

FOREIGN PATENT DOCUMENTS

JP          P2000-12688     *  1/2000

* cited by examiner

*Primary Examiner*—Jasmine J B Clark
(74) *Attorney, Agent, or Firm*—George O. Saile; Stephen B. Ackerman

(57) ABSTRACT

As current densities through wiring in integrated circuits increases, so too do failures due to electromigration. Such failure almost always occur in vias located at the ends of long lines. The present invention solves this problem by introducing, as part of the wiring, local back-diffusion sources that serve to increase back pressure on the metallic ions that makes up the wire, thereby reversing the trend towards electromigration. These sources are located close to the vias in question and may take the form of discrete local areas where the wiring is wider or they may be introduced in the form of dummy vias.

18 Claims, 2 Drawing Sheets

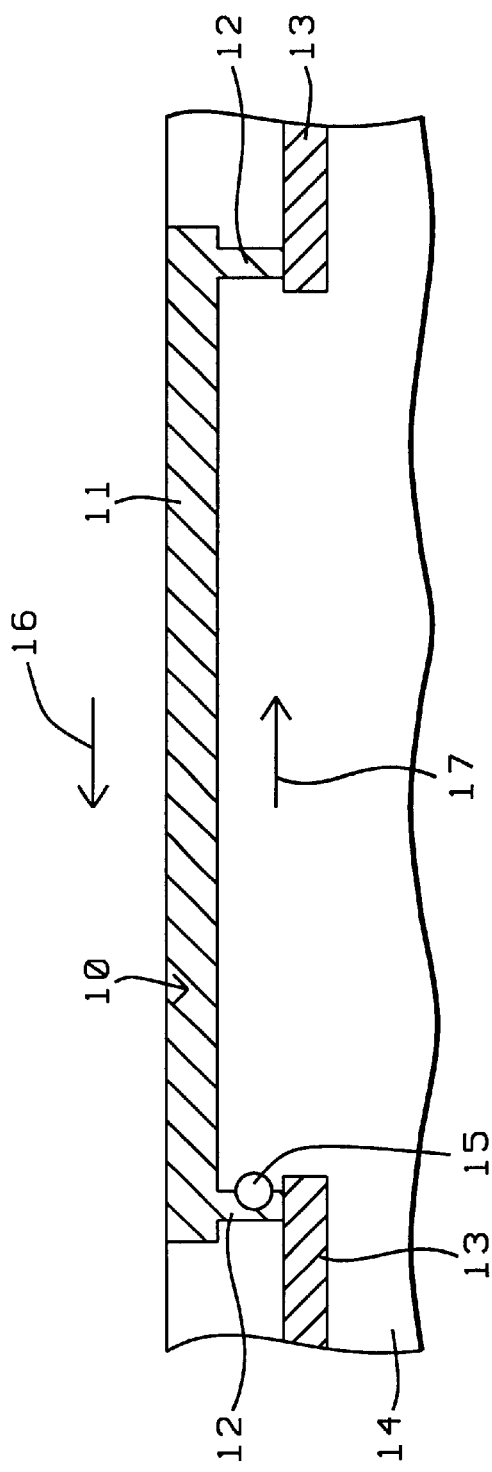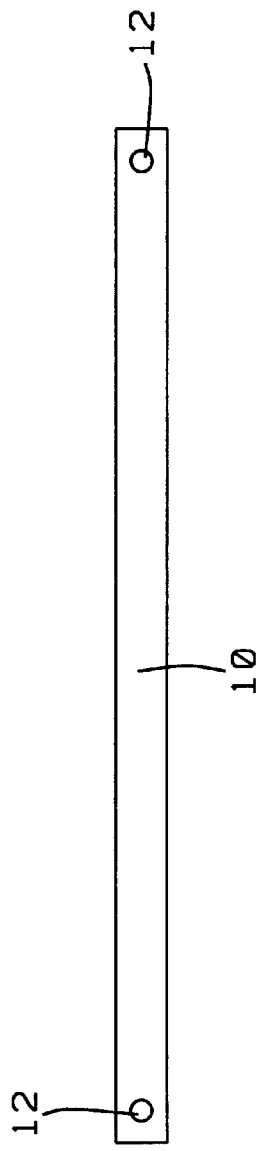
FIG. 1 – Prior Art
FIG. 2 – Prior Art

REDUCTION OF ELECTROMIGRATION IN DUAL DAMASCENE CONNECTOR

FIELD OF THE INVENTION

The invention relates to the general field of integrated circuits with particular reference to electromigration in connections of the dual damascene type.

BACKGROUND OF THE INVENTION

Electromigration (EM) has long been a problem for the semiconductor industry. Briefly stated, as electrons pass through a conductor they tend to drag the metallic ions of the conductor along with them through electrostatic attraction. This results in a slight concentration gradient in the direction of electron flow which in turn sets up an opposing diffusion gradient, or so-called back pressure, that tends to move ions towards regions of lower density. If current flows for long enough at a sufficiently high current density, the 'electron wind' effect dominates and vacancies form which eventually lead to voids and, finally, open circuits.

Referring now to FIG. 1, we illustrate the above observations by showing a cross-section of a standard dual damascene section of wiring such as would typically be found in an integrated circuit. Trench 10 has been formed in dielectric layer 14 and then just filled (by first overfilling and then planarizing) with metal 11. Vias 12 extend downwards from near the ends of the trench to the next lowest level of wiring 13. In this example, electrons normally flowed from left to right so movement of metal ions was in the direction shown by arrow 17. As discussed above this resulted in a diffusion gradient, or back pressure, in the direction of arrow 16.

Experience has shown that failure due to EM always occurred in the via (area 15 in FIG. 1, for example) at, or close to, the sites of current direction change. Additionally it was observed that no failures occurred when the connectors (wiring) were short (distance between vias less than about 50 microns). Also noted was that the failures were always associated with the topmost level of wiring. This latter observation was not unexpected since the topmost wiring level is known to carry the highest currents. FIG. 2 is a plan view looking down onto trench 10.

As expected, EM is more prevalent the lighter the ion involved. Thus, light metals such as aluminum or titanium exhibit EM effects much sooner than do heavier metals such as tungsten or tantalum. A number of solutions to the EM problem have been developed by the prior art, particularly for aluminum. Most notable of these has been the addition of a few percent of copper to the aluminum. Such a solution, while effective with respect to reducing EM, comes at the price of increasing the resistance of the connector. Thus, there exists a need for an approach that reduces EM without increasing the resistivity of the wiring material.

A routine search of the prior art was performed with the following references of interest being found:

In U.S. Pat. No. 5,696,030, Cronin is concerned with interconnect EM which is reduced by increasing the area over which contact is made to studs emerging from the chip's edge. In U.S. Pat. No. 5,963,831, Fu is also concerned with interconnect EM and effectively eliminates hot spots (areas of high current density) by using multiple parallel vias (not dummy vias). Adjustable series resistors are included which ensure equal current flow through each via.

In U.S. Pat. No. 5,770,519, Klein et al. line their vias with a metal that is known to exhibit high resistance to EM. This lining acts as a reservoir that fills in any voids in the main body of the via as soon as they form U.S. Pat. No. 6,091,080 (Usui) shows a method to evaluate EM in lines using a void while in U.S. Pat. No. 6,072,945, Aji et al. show a system for EM verification.

SUMMARY OF THE INVENTION

It has been an object of the present invention to provide, for an integrated circuit, wiring that is not subject to failures due to electromigration.

Another object has been to provide, for an integrated circuit, wiring that is not subject to failure inside a connecting via due to electromigration.

A further object has been to provide, for an integrated circuit, damascene wiring that is not subject to failure inside a connecting via due to electromigration.

A still further object has been to provide, for an integrated circuit, top level damascene wiring that is not subject to failure inside a connecting via due to electromigration.

Yet another object has been to provide, for an integrated circuit, very long top level damascene wiring that is not subject to failure inside a connecting via due to electromigration.

These objects have been achieved by introducing, as part of the wiring, local back-diffusion sources that serve to increase back pressure on the metal that makes up the wire, thereby reversing the trend towards electromigration. These sources are located close to the vias (inside which most electromigration failures are mainly found) and may take the form of discrete local areas where the wiring is wider or they may be introduced as dummy vias.

BRIEF DESCRIPTION OF THE DRAWINGS

FIG. 1 is across-sectional view of a typical damascene wiring structure, including a via that connects it to a lower wiring level, showing where a failure due to electromigration is most likely to occur.

FIG. 2 is a plan view of FIG. 1

DESCRIPTION OF THE PREFERRED EMBODIMENTS

The invention will be disclosed through a description of two of its embodiments that involve damascene wiring, but it will be understood by those skilled in the art that the invention is of a more general nature and may be applied to other types of wiring as well.

Figure 3:
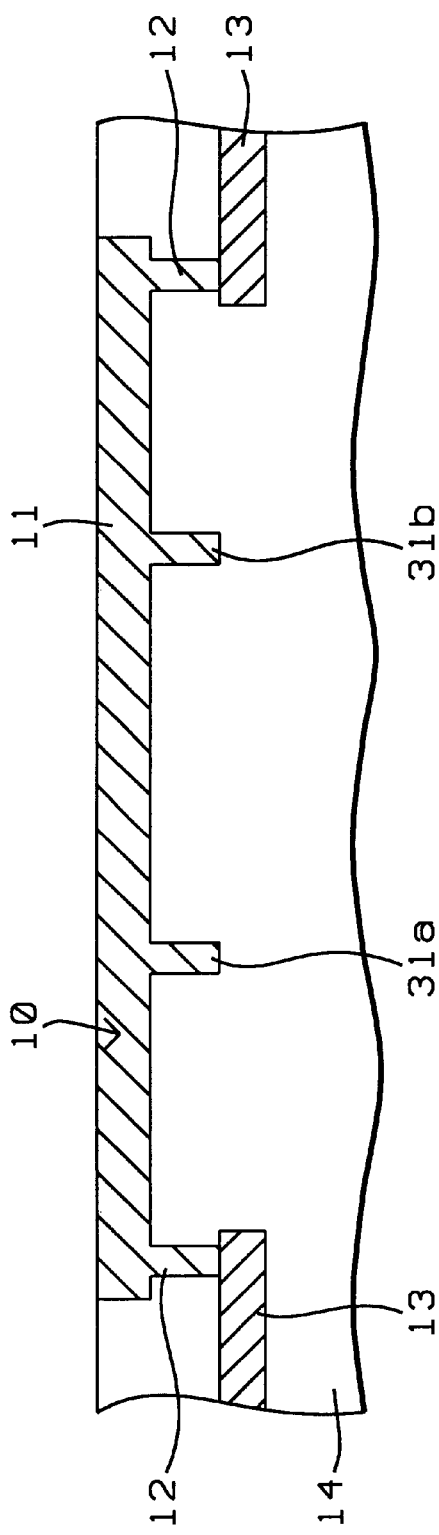
FIG. 3 illustrates a first embodiment of the invention wherein dummy vias are added to the structure of FIG. 1 to provide back-diffusion sources that prevent the occurrence of electromigration.

Referring now to FIG. 3, we show, as in FIG. 1, trench 10 which was formed in dielectric layer 14 and then just filled (by first overfilling and then planarizing) with metal 11 such as aluminum or copper. Vias 12 extend downwards from near the ends of the trench to the next lowest level of wiring 13.

In a key departure from the prior art, dummy vias 31a and 31b have been added to the structure. These dummy vias do not make contact with any other wiring, their purpose being to increase the amount (concentration) of metal 11 in their immediate vicinity, thereby providing back-diffusion sources that increase the 'back pressure' mentioned above.

The placement of the dummy vias is not important provided they are separated from the real vias by no more than a critical distance whose value depends on the current density that will later be run through the latter. Clearly, the dummy vias must not be allowed to connect to any other wiring. In cases where they cannot be located within the critical distance without doing so, their depth must be less than that of the real vias.

Note that, instead of dummy vias, back-diffusion sources can also be created by introducing a local thickening, in the upward direction, of the connector line. This is not as convenient as forming dummy vias but may be the only option in cases where there is no room for the dummy vias.

For extremely long connecting lines, it may be necessary to introduce additional dummy vias between 31*a* and 31*b* in order to avoid EM failure within the connector itself.

Figure 4:
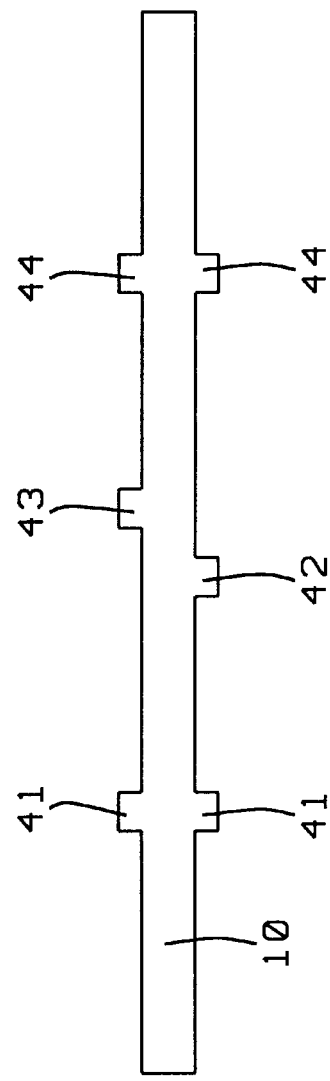
FIG. 4 illustrates a second embodiment of the invention wherein discrete areas of increased width are added to the structure of FIG. 1 to provide back-diffusion sources that prevent the occurrence of electromigration.

Referring now to FIG. 4, we show there a second embodiment of the invention wherein, instead of dummy vias, the width of the connector line is increased over a short distance. This increase is typically between about 0.1 and 10 microns. Each such area has a length whose value is between about 1 and 10 times that of the connector's width. This has the same effect as dummy vias with respect to providing back-diffusion sources that increase the 'back pressure'.

While our preferred implementation of the second embodiment is to locally increase the line width symmetrically from both sides of the conductor, such as wider regions 41 or 44, in situations where this may not be possible because of the proximity of other wiring the widening may be limited to only one side of the connector, such as region 42 or 43. As for the dummy vias, the wider regions must be separated from the vias by no more than a critical distance whose value depends on the current density that will later be run through the vias. Also, as before, it may be necessary to introduce additional wider regions, such as 42 and/or 43 between 41 and 44 in order to avoid EM failure within the connector itself.

A fringe benefit of the present invention, as described above, is that the added back-diffusion sources, be they dummy vias or locally wider regions, act as cooling fins for the connector line thereby improving power dissipation by the line.

The data shown below in TABLE I confirm the effectiveness of the present

TABLE I

| | | Mean time to failure due to EM | |
|---|---|---|---|
| Wire length (microns) | Current density during life | with added back-diffusion sources | no added back-diffusion sources |
| 30 | 2 MA/cm$^2$ | 272 hours | 304 hours |
| 50 | 2 MA/cm$^2$ | 268 hours | 236 hours |
| 100 | 2 MA/cm$^2$ | 131 hours | 49 hours |

This data confirms that the mean time to failure falls rapidly for wire lengths in excess of about 50 microns but that an improvement by almost a factor of three can be achieved by adding back-diffusion sources, as taught by the present invention.

While the invention has been particularly shown and described with reference to the preferred embodiments thereof, it will be understood by those skilled in the art that various changes in form and details may be made without departing from the spirit and scope of the invention.

What is claimed is:

1. A connecting line, having a first width, in an integrated circuit, comprising:

areas where the line has a second width that is greater than said first width, said areas being spaced a distance apart whereby they act as back-diffusion sources that oppose electromigration in the line.

2. The connecting line described in claim 1 wherein the second width is between about 1 and 10 times the first width.

3. The connecting line described in claim 1 wherein said areas extend away from one side of the line.

4. The connecting line described in claim 1 wherein said areas extend away from both sides of the line.

5. The connecting line described in claim 1 wherein each of said areas has a length whose value is between about 1 and 10 times that of said first width.

6. The connecting line described in claim 1 wherein said areas improve power dissipation by the line.

7. A dual damascene connector, comprising:

a dielectric layer having a top surface;

a trench, having a first width, opposing ends, and a floor, extending downwards from said top surface;

via holes located, one on one, near said ends and extending downwards from the trench floor to a lower wiring level;

regions where the trench has a second width that is greater than said first width, said regions being separated from the via holes by no more than a critical distance that is a function of a current density, said current density being that which will pass through the via when it is in use; and said trench, via holes, and regions being filled with metal.

8. The connector described in claim 7 wherein said first width is between about 0.1 and 10 microns.

9. The connector described in claim 7 wherein said second width is between about 0.2 and 10 microns.

10. The connector described in claim 7 wherein each of said regions has a length whose value is between about 1 and 10 times that of said first width.

11. The connector described in claim 7 wherein said regions extend away from one side of the trench.

12. The connector described in claim 7 wherein said regions extend away from both sides of the trench.

13. The connector described in claim 7 wherein said metal is selected from the group consisting of aluminum and copper.

14. A dual damascene connector, comprising:

a dielectric layer having a top surface;

a trench, having opposing ends and a floor, extending downwards from said top surface;

via holes, located one on one near said ends and extending downwards from the trench floor a first distance to a lower wiring level;

dummy holes located between the via holes and extending downwards from the trench floor a second distance that is less than or equal to said first distance, said dummy holes being separated from the via holes by no more than a critical distance that is a function of a current density, said current density being that which will pass through the via when it is in use; and said trench, via holes, and dummy holes being filled with metal.

15. The connector described in claim 14 wherein said first distance is between about 10 and 100 microns.

16. The connector described in claim 14 wherein said second distance is between about 20 and 100 microns.

17. The connector described in claim 14 wherein each dummy hole has a cross-sectional area similar to that of the via hole.

18. The connector described in claim 14 wherein said metal is selected from the group consisting of aluminum and copper.

* * * * *